(12) United States Patent
Lee et al.

(10) Patent No.: US 12,199,199 B2
(45) Date of Patent: Jan. 14, 2025

(54) OPTICAL SENSOR AND DISPLAY DEVICE INCLUDING THE OPTICAL SENSOR

(71) Applicant: SAMSUNG DISPLAY CO., LTD., Yongin-si (KR)

(72) Inventors: Ki June Lee, Yongin-si (KR); Jung Ha Son, Yongin-si (KR); Tae Sung Kim, Yongin-si (KR); Jae Ik Lim, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/503,148

(22) Filed: Nov. 6, 2023

(65) Prior Publication Data

US 2024/0072182 A1    Feb. 29, 2024

Related U.S. Application Data

(62) Division of application No. 16/991,853, filed on Aug. 12, 2020, now Pat. No. 11,894,470.

(30) Foreign Application Priority Data

Dec. 3, 2019   (KR) .......................... 10-2019-0159180

(51) Int. Cl.
*H01L 27/146*    (2006.01)
*H01L 27/144*    (2006.01)
*H01L 31/0216*   (2014.01)

(52) U.S. Cl.
CPC .... *H01L 31/02161* (2013.01); *H01L 27/1443* (2013.01); *H01L 27/14678* (2013.01); *H01L 27/14612* (2013.01); *H01L 27/14623* (2013.01); *H01L 27/14625* (2013.01)

(58) Field of Classification Search
None
See application file for complete search history.

(56) References Cited

U.S. PATENT DOCUMENTS 8,748,835 B2   6/2014  Lim
10,476,038 B2  11/2019 Park et al.
10,665,661 B2   5/2020 Park et al.
(Continued)

FOREIGN PATENT DOCUMENTS

CN    109524435 A    3/2019
JP    2010003752     1/2010
(Continued)

OTHER PUBLICATIONS

Office Action dated Oct. 23, 2024, in corresponding Chinese Patent Application No. 202010999367.4, 2 pages.

*Primary Examiner* — Benjamin P Sandvik
(74) *Attorney, Agent, or Firm* — F. CHAU & ASSOCIATES, LLC

(57) ABSTRACT

An optical sensor includes a substrate, a photoelectric element disposed on the substrate and that includes a first electrode, an intermediate layer disposed on the first electrode, and a second electrode disposed on the intermediate layer, a barrier layer disposed on the second electrode, an insulating layer that covers the photoelectric element and the barrier layer, and a bias electrode disposed on the insulating layer and electrically connected to the second electrode. The barrier layer is spaced apart from the first electrode.

7 Claims, 13 Drawing Sheets

(56) References Cited

U.S. PATENT DOCUMENTS

| | | |
|---|---|---|
| 10,804,314 B2 | 10/2020 | Misaki |
| 2010/0059804 A1 | 3/2010 | Hayashi et al. |
| 2010/0171122 A1 | 7/2010 | Eguchi |
| 2018/0121701 A1 | 5/2018 | Ling et al. |
| 2019/0251326 A1 | 8/2019 | Sun |
| 2020/0066546 A1 | 2/2020 | Ahn et al. |
| 2020/0091221 A1* | 3/2020 | Nakazawa ........ H01L 27/14614 |
| 2020/0127154 A1 | 4/2020 | Lee et al. |
| 2021/0050378 A1 | 2/2021 | Lu et al. |
| 2021/0167229 A1 | 6/2021 | Lee et al. |
| 2021/0175274 A1* | 6/2021 | Yoon ................. H01L 27/14612 |
| 2021/0336071 A1* | 10/2021 | Huang .............. H01L 31/02327 |

FOREIGN PATENT DOCUMENTS

| | | |
|---|---|---|
| KR | 10-1769587 | 8/2017 |
| KR | 10-2019-0042788 | 4/2019 |
| KR | 10-2019-0073202 | 6/2019 |

\* cited by examiner

OPTICAL SENSOR AND DISPLAY DEVICE INCLUDING THE OPTICAL SENSOR

This application is a divisional of U.S. patent application Ser. No. 16/991,853, filed on Aug. 12, 2020 in the U.S. Patent and Trademark Office, which claims priority under 35 U.S.C. § 119 from, and the benefit of, Korean Patent Application No. 10-2019-0159180, filed on Dec. 3, 2019 in the Korean Intellectual Property Office, the contents of both of which are herein incorporated by reference in their entireties.

BACKGROUND

1. Technical Field

Embodiments of the disclosure are directed to an optical sensor and a display device that includes the optical sensor.

2. Discussion of the Related Art

Recently, as display devices such as smart phones or tablet PCs are utilized in various fields, a biometric information authentication method that uses a user's fingerprint, etc., has been widely used. To provide a fingerprint sensing function, a fingerprint sensor is provided in a form embedded or attached to the display device.

A fingerprint sensor integrated display device uses a sensor that can sense light. A fingerprint sensor integrated display device that uses a light sensing method uses a light emitting element provided in a pixel as a light source, and includes an optical sensor array. The optical sensor array can be implemented with, for example, a CMOS image sensor (CIS).

A CMOS image sensor includes a P-intrinsic-N (PIN) diode with a vertical structure. To accurately transfer a small amount of sensing current output from the PIN diode to the outside without noise, a structure and a manufacturing method capable of minimizing a leakage current are required.

SUMMARY

Embodiments of the disclosure provide an optical sensor and a display device capable of minimizing or prevent a leakage current.

Embodiments of the disclosure are not limited to the above-described embodiment, and other embodiments not described may be clearly understood by those skilled in the art from the following description.

An optical sensor according to an embodiment includes a substrate, a photoelectric element disposed on the substrate, where the photoelectric element includes a first electrode, an intermediate layer disposed on the first electrode, and a second electrode disposed on the intermediate layer, a barrier layer disposed on the second electrode, an insulating layer that covers the photoelectric element and the barrier layer, and a bias electrode disposed on the insulating layer and electrically connected to the second electrode. The barrier layer is spaced apart from the first electrode.

The bias electrode may be connected to the second electrode through a contact hole that penetrates the insulating layer and the barrier layer.

A side surface of the barrier layer may be aligned with a side surface of the photoelectric element.

A side surface of the second electrode may be covered by the barrier layer.

The barrier layer may be formed of an inorganic film.

The insulating layer may be in contact with the intermediate layer, but is separated from the second electrode by the barrier layer.

A thickness of the insulating layer may be greater than a thickness of the barrier layer.

An optical sensor according to another embodiment includes a substrate, a photoelectric element disposed on the substrate, where the photoelectric element includes a first electrode, an intermediate layer disposed on the first electrode, and a second electrode disposed on the intermediate layer, an insulating layer disposed on the photoelectric element, a bias electrode disposed on the insulating layer and electrically connected to the second electrode, and a conductive pattern that covers an outer side surface of the insulating layer. An inner side surface of the insulating layer covers a side surface of the photoelectric element.

The conductive pattern may be in a floating state.

The bias electrode may be in direct contact with the second electrode through a contact hole that penetrates the insulating layer.

The conductive pattern may be formed of a transparent metal oxide.

The transparent metal oxide may include at least one of ITO, IZO, or ZnO.

The intermediate layer may include an N-type semiconductor layer disposed on the first electrode, an I-type semiconductor layer disposed on the N-type semiconductor layer, and a P-type semiconductor layer disposed on the I-type semiconductor layer.

The optical sensor may further include a circuit element layer disposed between the substrate and the photoelectric element. The circuit element layer may include an active pattern that includes a channel region, a source region disposed on one side of the channel region, and a drain region disposed on another side of the channel region, a gate insulating layer that covers the active pattern, a gate electrode disposed on the gate insulating layer and that overlaps the channel region, an interlayer insulating layer that covers the gate electrode, a source electrode disposed on the interlayer insulating layer and connected to the source region and a drain electrode disposed on the interlayer insulating layer and connected to the drain region, and a protective layer that covers the source electrode and the drain electrode.

The optical sensor may further include a planarization layer that directly covers the conductive pattern, the bias electrode, and the insulating layer.

A display device according to an embodiment includes a display panel that includes a plurality of pixels, and an optical sensor disposed on one surface of the display panel and that includes a plurality of sensor pixels. Each sensor pixel includes a substrate, a photoelectric element disposed on the substrate, where the photoelectric element includes a first electrode, an intermediate layer disposed on the first electrode, and a second electrode disposed on the intermediate layer, a barrier layer disposed on the second electrode, an insulating layer that covers the photoelectric element and the barrier layer, and a bias electrode disposed on the insulating layer and electrically connected to the second electrode. The insulating layer is in contact with the intermediate layer, but is spaced apart from the second electrode.

The display panel may include a display substrate and an opening array layer disposed on the display substrate, and the opening array layer may include a light blocking layer, and an opening portion that penetrates the light blocking layer.

The opening array layer may include a first opening array layer disposed on the display substrate and a second opening array layer disposed on the first opening array layer. The first opening array layer may include a first light blocking layer and a first opening portion that penetrates the first light blocking layer, and the second opening array layer may include a second light blocking layer, and a second opening portion that penetrates the second light blocking layer. The first opening portion may overlap the second opening portion.

The display device may further include a collimator disposed between the display panel and the optical sensor, and the collimator may include a light blocking portion and a light transmitting portion that penetrates the light blocking portion.

The light blocking portion and the light transmitting portion may be formed of an organic material.

Specific details of other embodiments are included in the detailed description and drawings.

In accordance with an optical sensor and a display device according to embodiments, occurrence of a leakage current on a side surface of the photoelectric element is minimized or prevented by disposing a barrier layer on a photoelectric element.

Therefore, noise in a sensing current is reduced, and as a result, accuracy of fingerprint sensing is improved.

DETAILED DESCRIPTION OF EXEMPLARY EMBODIMENTS

Figure 1:
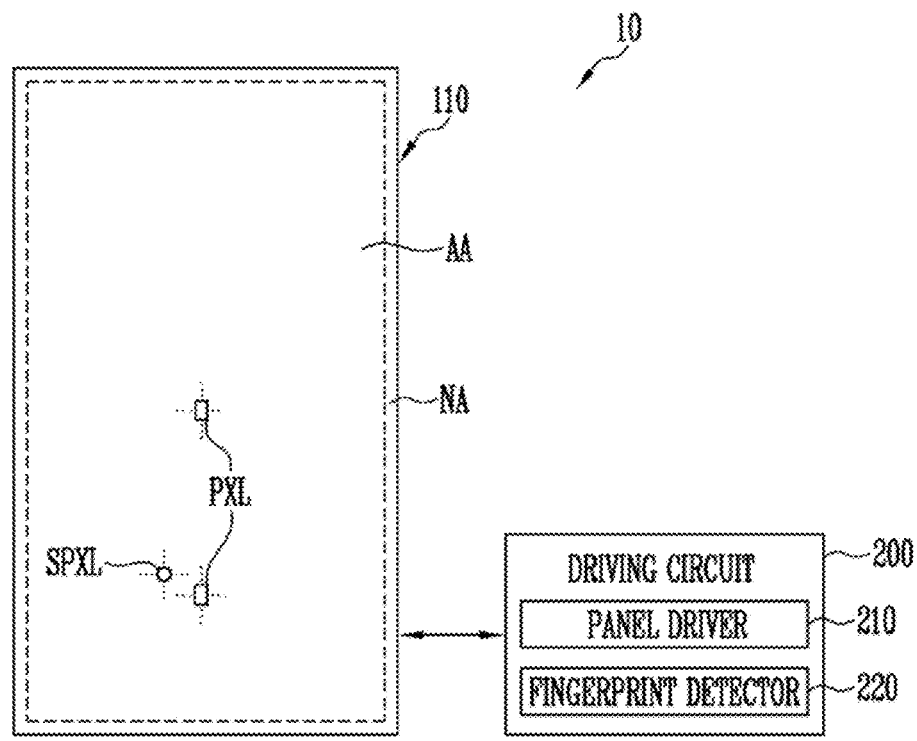
FIG. 1 is a plan view of a display device according to an embodiment.

Features of the disclosure and a method of achieving them will become apparent with reference to the embodiments described in detail below together with the accompanying drawings. However, embodiments of the disclosure are not limited to exemplary embodiments disclosed below, and may be implemented in various different forms. Exemplary embodiments are provided so that the disclosure will be thorough and complete and those skilled in the art to which the disclosure pertains can fully understand the scope of the disclosure. Embodiments of the disclosure are only defined by the scope of the claims.

A case in which an element or a layer is referred to as "on" another element or layer includes a case in which another layer or another element is disposed directly on the other element or between the other layers. The same reference numerals may denote to the same components throughout the specification.

Hereinafter, exemplary embodiments will be described with reference to the accompanying drawings.

FIG. 1 is a plan view of a display device according to an embodiment.

In the present specification, "upper portion", "top", and "upper surface" indicate an upper direction, that is, a Z-axis direction with respect to a display device 10, and "lower portion", "bottom", and "lower surface" indicate a lower direction, that is, a direction opposite to the Z-axis direction with respect to the display device 10. In addition, "left", "right", "up", and "down" indicate directions when viewed the display device 10 in a plan view.

Referring to FIG. 1, according to an embodiment, the display device 10 may have one of various shapes. For example, the display device 10 may have a rectangular plate shape with two pairs of parallel sides. The display device 10 can display various visual information, for example, a text, a video, a photograph, a two-dimensional or three-dimensional image, etc., in an image display direction.

According to an embodiment, all or at least a portion of the display device 10 may be flexible. For example, the display device 10 may be flexible in the entire area, or may be partially flexible in an area where flexibility is required.

According to an embodiment, the display device 10 includes a display panel 110 and a driving circuit 200 that drives the display panel 110. For convenience of description, the display panel and the driving circuit are shown as separate from each other in FIG. 1, but embodiments are not limited thereto. That is, in other embodiments, all or portion of the driving circuit is integrally implemented on the display panel 110.

According to an embodiment, the display panel 110 includes a display area AA and a non-display area NA.

According to an embodiment, the display area AA is an area for displaying an image and includes a plurality of display pixels PXL. In addition, the display area AA is used as a detection member for detecting the external environment. For example, the display area AA includes a fingerprint recognition area that recognizes a user's fingerprint. Therefore, the display area AA includes the plurality of display pixels PXL and a plurality of sensor pixels SPXL.

According to an embodiment, the sensor pixels SPXL are sensors that sense light. For example, when light emitted from a light source provided in the display device 10 is reflected by the user's finger, the sensor pixels SPXL sense the reflected light and output a corresponding electrical signal, such as a voltage signal. The electrical signal is transmitted to the driving circuit 200, which will be described below, and used for fingerprint sensing. Hereinafter, embodiments of the disclosure will be described using an example in which the sensor pixels SPXL are used for fingerprint sensing, but the sensor pixels SPXL can perform various other functions such as touch sensing or scanning.

According to an embodiment, the sensor pixels SPXL may overlap the display pixels PXL or may be disposed around the display pixels PXL. For example, some or all of the sensor pixels SPXL overlap the display pixels PXL or are disposed between the display pixels PXL. When the sensor pixels SPXL are disposed adjacent to or overlapping the display pixels PXL, the sensor pixels SPXL use a light emitting element provided in the display pixel PXL as a light source. In this case, the sensor pixels SPXL together with the light emitting elements provided in the display pixels PXL configure a fingerprint sensor used in a light sensing method. As described above, when a fingerprint sensing display device uses the display pixels PXL as a light source without a separate external light source, a thickness of the fingerprint sensor and a module of the display device that includes the fingerprint sensor can be reduced, and manufacturing cost can be reduced.

According to an embodiment, the non-display area NA is a remaining area of the display panel 110. For example, the non-display area NA includes a scan driver that transmits scan signals to scan lines, fan out lines that connect data lines and a display driver to each other, and pads connected to a circuit board. The non-display area NA is opaque. The non-display area NA may be a decor layer in which a pattern is displayed to the user.

According to an embodiment, the driving circuit 200 drives the display panel 110. For example, the driving circuit 200 outputs data signals that correspond to image data to the display panel 110, or outputs driving signals to the sensor pixel SPXL and receives electrical signals, such as a sensing signal, from the sensor pixels SPXL. The driving circuit 200 detects a user's fingerprint pattern using the electrical signals.

According to an embodiment, the driving circuit 200 includes a panel driver 210 and a fingerprint detector 220. For convenience of description, in FIG. 1, the panel driver 210 and the fingerprint detector 220 are shown separate from each other, but embodiments are not limited thereto. For example, in other embodiments at least a portion of the fingerprint detector 220 can be integrated together with the panel driver 210 or can operate in conjunction with the panel driver 210.

According to an embodiment, the panel driver 210 sequentially transmits data signals that correspond to the image data to the display pixels PXL while sequentially scanning the display pixels PXL of the display area AA. Therefore, the display panel 110 displays an image that corresponds to the image data.

According to an embodiment, the panel driver 210 transmits a driving signal for fingerprint sensing to the display pixels PXL. Such a driving signal is provided to cause the display pixels PXL to emit light to operate as alight source for the sensor pixels SPXL. The fingerprint sensing driving signal is transmitted to the display pixels PXL in a specific area of the display panel 110, such as display pixels PXL provided in a sensing area SA. In some embodiments, the fingerprint sensing driving signal is provided by the fingerprint detector 220.

Figure 2:
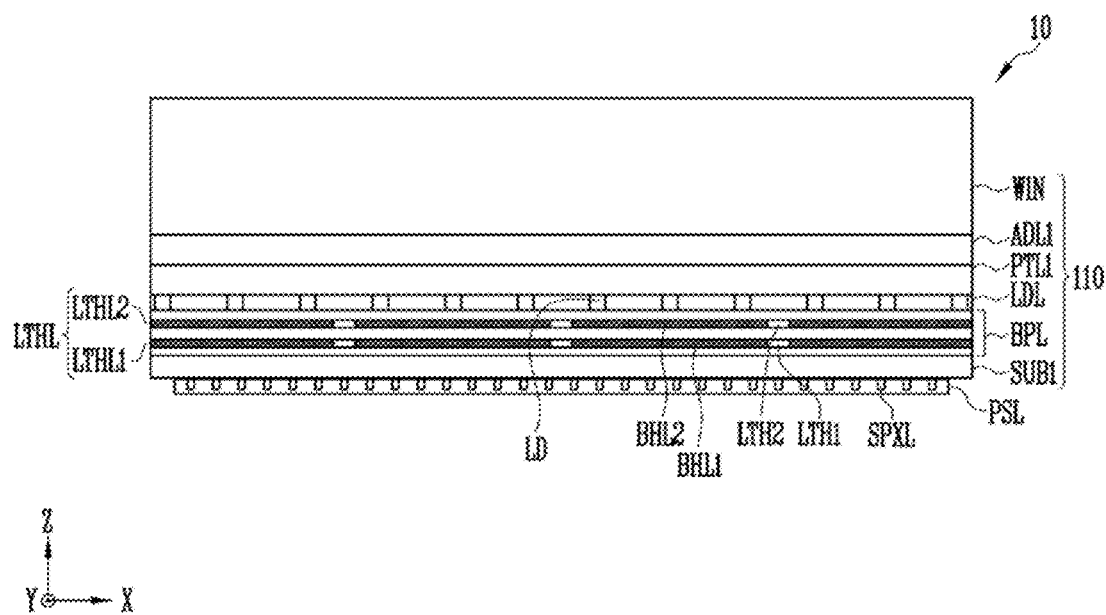
FIG. 2 is a cross-sectional view of a display device according to an embodiment.

According to an embodiment, the fingerprint detector 220 transmits a driving signal, such as a driving voltage, for driving the sensor pixels SPXL to the sensor pixels SPXL, and detects a user's fingerprint based on the electrical signals received from the sensor pixels SPXL FIG. 2 is a cross-sectional view of a display device according to an embodiment.

Referring to FIG. 2, according to an embodiment, the display device 10 includes the display panel 110 and an optical sensor PSL disposed on one surface of the display panel 110.

According to an embodiment, the display panel 100 is a light emitting display panel that includes a light emitting element. For example, the display panel 110 may be an organic light emitting display panel that uses an organic light emitting diode that includes an organic light emitting layer, a micro light emitting diode (LED) display panel that uses a micro LED, a quantum dot light emitting display panel that uses a quantum dot light emitting diode that includes a quantum dot emitting layer, or an inorganic light emitting display panel that uses an inorganic light emitting element that includes an inorganic semiconductor. Hereinafter, a description will be given based on an embodiment in which the display panel 110 is an organic light emitting display panel.

According to an embodiment, the display panel 110 includes a display substrate SUB1, a circuit element layer BPL, a light emitting element layer LDL, a protective layer PTL1, an adhesive layer ADL1, and a cover window WIN.

According to an embodiment, the display substrate SUB1 is formed of a flexible material that can be bent or folded. For example, a flexible material includes at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. However, embodiments are not limited thereto, and the material of the display substrate SUB1 can be variously changed, and can be formed of fiber glass plastic (FRP), etc.

According to an embodiment, the circuit element layer BPL is disposed on the display substrate SUB1. The circuit element layer BPL includes a plurality of circuit elements that configure a pixel circuit of the display pixels PXL, and wires that transmit various power and signals that drive the display pixels PXL. In this case, the circuit element layer BPL includes various circuit elements, such as at least one transistor and a capacitor, and a plurality of conductive layers that configure wires connected thereto. In addition, the circuit element layer BPL includes an insulating layer disposed between the plurality of conductive layers. In addition, the circuit element layer BPL includes a wire portion disposed in the non-display area NA of the display substrate SUB1 to supply power and signals that correspond to the wires connected to the display pixels PXL.

According to an embodiment, the circuit element layer BPL includes an opening array layer LTHL. The opening array layer LTHL is a light control layer that controls a path of light incident on the optical sensor PSL. For example, the opening array layer LTHL limits an observation field of view of reflected light to a predetermined angle range.

According to an embodiment, the opening array layer LTHL includes a first opening array layer LTHL1 and a second opening array layer LTHL2.

According to an embodiment, the first opening array layer LTHL1 is disposed on the display substrate SUB1. The second opening array layer LTHL2 is disposed on the first opening array layer LTHL1.

According to an embodiment, the first opening array layer LTHL1 includes a first light blocking layer BHL1 and a first opening portion LTH1 that penetrates the first light blocking layer BHL1. The second opening array layer LTHL2 includes a second light blocking layer BHL2 and a second opening portion LTH2 that penetrates the second light blocking layer BHL2. The first opening portion LTH1 overlaps the second opening portion LTH2. The first opening portion LTH1 and the second opening portion LTH2 may have the same or different diameters.

According to an embodiment, FIG. 2 illustrates a case where the opening array layer LTHL has a structure in which the first opening array layer LTHL1 and the second opening array layer LTHL2 are stacked. However, embodiments of the present disclosure are not limited thereto. That is, in other embodiments, the opening array layer LTHL may have a single opening array layer, or may have a multilayer structure of three or more layers.

According to an embodiment, the light emitting element layer LDL is disposed on the circuit element layer BPL. The light emitting element layer LDL includes light emitting elements LD, such as a pixel electrode, a light emitting layer, and a common electrode. The light emitting elements LD are electrically connected to a circuit element of the circuit element layer BPL.

According to an embodiment, the protective layer PTL1 is disposed on the light emitting element layer LDL. The protective layer PTL1 prevents oxygen or moisture from penetrating into the light emitting element layer LDL. To this end, the protective layer PTL1 includes at least one inorganic film. The inorganic film may be a silicon nitride layer, a silicon oxy nitride layer, a silicon oxide layer, a titanium oxide layer, or an aluminum oxide layer, but is not limited thereto.

In addition, according to an embodiment, the protective layer PTL1 protects the light emitting element layer LDL from foreign substances such as dust. To this end, the protective layer PTL1 includes at least one organic film. The organic film may be an acryl resin, an epoxy resin, a phenolic resin, a polyamide resin, or a polyimide resin, but is not limited thereto.

According to an embodiment, the adhesive layer ADL1 is disposed on the protective layer PTL1. The adhesive layer ADL1 is disposed between the protective layer PTL1 and the cover window WIN to couple the protective layer PTL1 and the cover window WIN to each other. The adhesive layer ADL1 includes a transparent adhesive such as an optical clear adhesive (OCA).

According to an embodiment, the cover window WIN is formed of a flexible material so that all or a portion of the cover window WIN can be bent or folded, as a protection member disposed at the uppermost end of a module of the display device 10. For example, the cover window WIN has a multilayer structure selected from a plastic film and a plastic substrate. The multilayer structure is formed through a continuous process or an adhesive process using an adhesive layer. An example of a plastic that can be applied to the cover window WIN includes polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyallylate, tri-acetyl cellulose (TAC), or cellulose acetate propionate (CAP), but is not limited thereto.

According to an embodiment, the display device 10 further includes a polarizing plate or a sensing layer. In this case, the polarizing plate or the sensing layer are disposed between the protective layer PTL1 and the cover window WIN.

According to an embodiment, the optical sensor PSL is disposed on one surface of the display panel 110. For example, the optical sensor PSL is disposed on a rear surface of the display panel 110 that faces a display surface. That is, the optical sensor PSL is disposed on a lower surface of the display substrate SUB1, but embodiments are not limited thereto. An adhesive layer or a protective layer are further disposed between the optical sensor PSL and the display substrate SUB1. The optical sensor PSL is attached to the display substrate SUB1 by the adhesive layer. The adhesive layer may include a transparent adhesive such as OCA, or may include a pressure sensitive adhesive (PSA).

According to an embodiment, the optical sensor PSL includes a plurality of sensor pixels SPXL distributed at a predetermined resolution or interval.

According to an embodiment, the sensor pixels SPXL have a number, size, and arrangement that is appropriate to generate an identifiable fingerprint image from the electrical signals output from the sensor pixels SPXL. A distance between the sensor pixels SPXL is closely set so that reflected light from a sensing object, such as a fingerprint of a user's finger, etc., is incident on at least two adjacent sensor pixels SPXL.

According to an embodiment, the sensor pixels SPXL sense external light and output a corresponding electrical signal, such as a voltage signal. The reflected light received by each of the sensor pixels SPXL may have different light characteristics, such as frequency, wavelength, intensity, etc., according to whether the reflected light is generated by a valley or a ridge of the user's fingerprint. Therefore, each of the sensor pixels SPXL outputs a voltage signal that has different electrical characteristics that correspond to the light characteristics of the reflected light. The voltage signal output by the sensor pixels SPXL is converted into image data by the fingerprint detector 220 and used to identify the user's fingerprint.

A description has been given focusing on an embodiment in which the display device 10 uses the light emitting elements LD of the display pixels PXL as the light source of the fingerprint sensor, but embodiments of the disclosure are not limited thereto. For example, in other embodiments, the display device includes a separate light source for the fingerprint sensing.

Figure 3:
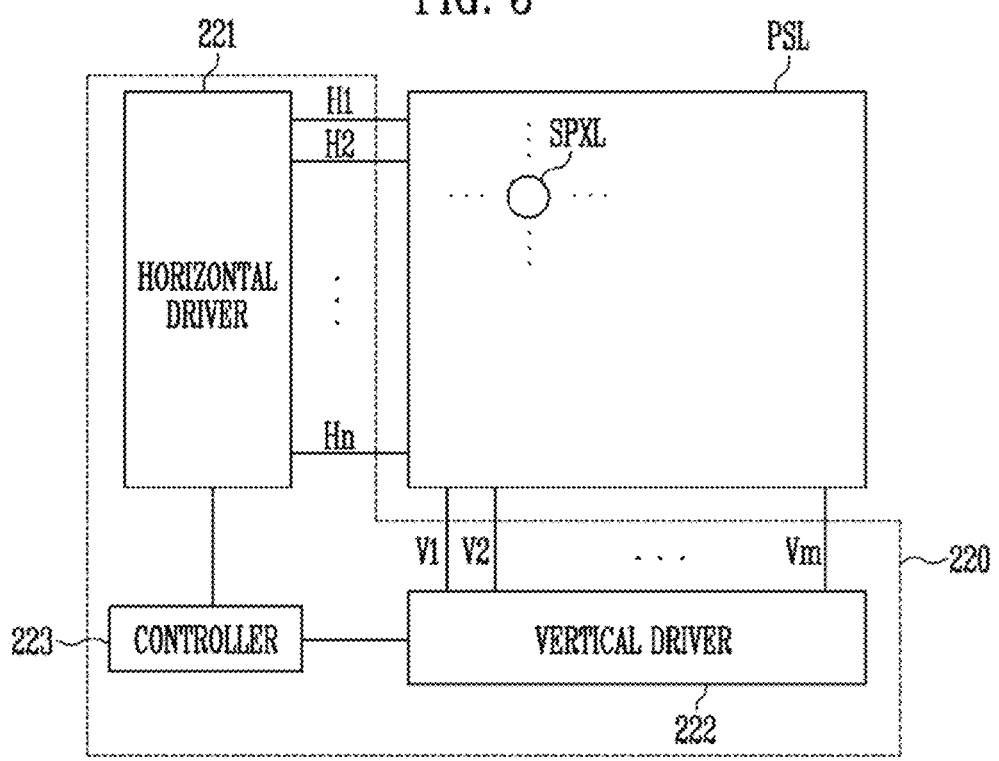
FIG. 3 is a plan view of an optical sensor and a fingerprint detector according to an embodiment.

FIG. 3 is a plan view of an optical sensor and a fingerprint detector according to an embodiment.

Referring to FIG. 3, according to an embodiment, the optical sensor PSL includes an array of the sensor pixels SPXL. For example, the sensor pixels SPXL are arranged in a two-dimensional array, but embodiments are not limited thereto. Each sensor pixel SPXL includes a photoelectric element that converts incident light into a charge according to a frequency of the light. A detailed description of the photoelectric element will be described below with reference to FIG. 4.

According to an embodiment, the fingerprint detector 220 includes a horizontal driver 221, a vertical driver 222, and a controller 223.

According to an embodiment, the horizontal driver 221 is connected to the sensor pixels SPXL through driving lines H1 to Hn. The horizontal driver 221 may be a shift register or an address decoder. The horizontal driver 221 transmits a driving signal to drive selected sensor pixels SPXL. For example, the horizontal driver 221 transmits a driving signal to units of sensor pixel rows.

According to an embodiment, the sensor pixels SPXL selected and driven by the horizontal driver 221 sense light using the photoelectric element in the sensor pixels SPXL, and output an electrical signal that corresponds to the sensed light, such as a voltage signal. The output electrical signal is, for example, an analog signal.

According to an embodiment, the vertical driver 222 is connected to the sensor pixels SPXL through signal lines V1 to Vm. The vertical driver 222 processes the signals output from the sensor pixels SPXL.

According to an embodiment, the vertical driver 222 performs, for example, a correlated double sampling (CDS) process to remove noise from a received electrical signal. In addition, the vertical driver 222 converts an analog signal received from the sensor pixels SPXL into a digital signal.

An analog-to-digital converter is provided for each column of the sensor pixels SPXL, and the analog signals received from the sensor pixel columns are processed in parallel.

According to an embodiment, the vertical driver 222 may be a shift register or an address decoder. For example, the vertical driver 222 sequentially selects a process circuit corresponding to a column of the sensor pixels SPXL, such as the analog-digital converter. An electrical signal, such as a digital signal, processed by the process circuit selected by the vertical driver 222 is output.

According to an embodiment, the controller 223 is a timing generator that generates various timing signals, and controls the horizontal driver 221 and the vertical driver 222 based on the timing signals generated by the timing generator.

According to an embodiment, the controller 223 generates image data from the electrical signals received from the vertical driver 222, and processes the generated image data. In addition, the controller 223 detects a fingerprint from the processed image data, or authenticates the detected fingerprint or outputs the detected fingerprint.

However, embodiments of the disclosure are not limited thereto, and in other embodiments, the generation of the image data and the fingerprint detection are not performed by the controller 223 but are performed by an external host processor, etc. In this case, the controller 223 directly transmits the electrical signals received from the vertical driver 222, such as digital signals, to the external host processor or the panel driver 210.

Figure 4:
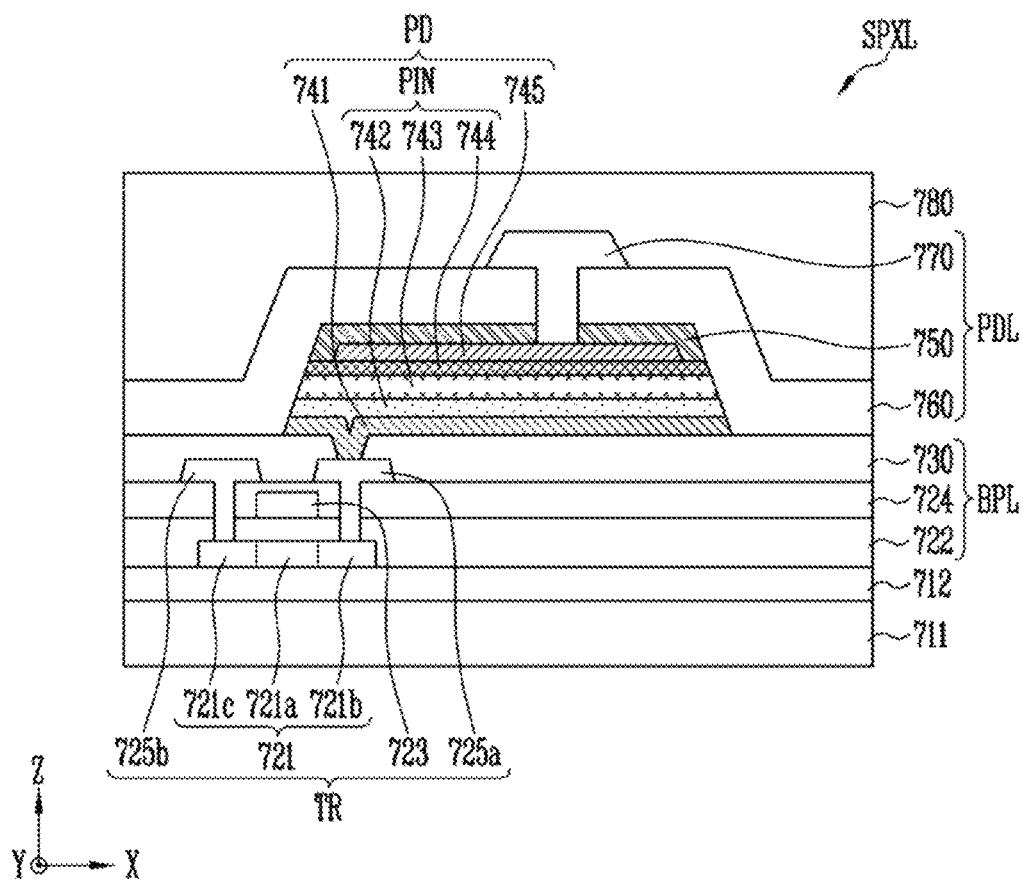
FIG. 4 is a cross-sectional view of a sensor pixel of FIG. 3.

FIG. 4 is a cross-sectional view of a sensor pixel of FIG. 3, according to an embodiment.

Referring to FIG. 4, according to an embodiment, the sensor pixel SPXL may include a substrate 711, a buffer layer 712, a circuit element layer BPL, a photoelectric element layer PDL, and a planarization layer 780.

According to an embodiment, the substrate 711 is a base substrate of the optical sensor PSL, and may be a rigid substrate that includes glass or tempered glass, or a flexible substrate of a plastic material. However, embodiments are not limited thereto, and in other embodiments, the substrate 711 may be configured of various other materials.

According to an embodiment, the buffer layer 712 is disposed on the substrate 711. The buffer layer 712 may be configured as a single layer or as multiple layers of a silicon oxide film (SiOx) or a silicon nitride film (SiNx).

According to an embodiment, the circuit element layer BPL is disposed on the buffer layer 712. The circuit element layer BPL includes a photoelectric element transistor TR and a plurality of insulating layers.

According to an embodiment, the transistor TR includes an active pattern 721, a gate electrode 723, a source electrode 725a, and a drain electrode 725b. For example, the transistor TR may be one of an oxide thin film transistor (oxide TFT) formed of an indium gallium zinc oxide (IGZO)-based material, a low temperature polycrystalline silicon (LTPS) transistor, or an amorphous silicon thin film transistor (a-Si TFT).

According to an embodiment, the active pattern 721 is disposed on the buffer layer 712. The active pattern 721 includes a channel region 721a through which an electron moves, a source region 721b disposed on one side of the channel region 721a, and a drain region 721c disposed on another side of the channel region 721a.

According to an embodiment, a gate insulating layer 722 is disposed on the active pattern 721. The gate insulating layer 722 insulates the active pattern 721 from the gate electrode 723, which will be described below. The gate insulating layer 722 includes one or more inorganic films or organic films. The gate insulating layer 722 may be formed of a single layer or of multiple layers of a silicon oxide film (SiOx) or a silicon nitride film (SiNx). However, embodiments of the disclosure are not limited thereto, and in other embodiments, the gate insulating layer 722 may include an inorganic insulating material or an organic insulating material such as SiOx, SiNx, SiON, SiOF, or AlOx.

According to an embodiment, the gate electrode 723 is disposed on the gate insulating layer 722. The gate electrode 723 overlaps the channel region 721a of the active pattern 721. The gate electrode 723 may have a single layer or multiple layers configured of a conductive material. For example, the gate electrode 723 may include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, or Pb, etc. For example, the gate electrode 723 can be formed of an alloy of MoTi and AlNiLa. For example, the gate electrode 723 may have multiple layers, such as one of Ti/Cu, Ti/Au, Mo/Al/Mo, ITO/Ag/ITO, TiN/T/Al/Ti, or TiN/Ti/Cu/Ti, etc.

According to an embodiment, an interlayer insulating layer 724 is disposed on the gate electrode 723. The interlayer insulating layer 724 includes one or more inorganic films or organic films. For example, the interlayer insulating layer 724 may be formed of a single layer or include multiple layers of a silicon oxide film (SiOx) or a silicon nitride film (SiNx).

According to an embodiment, the source electrode 725a and the drain electrode 725b are disposed on the interlayer insulating layer 724. The source electrode 725a is electrically connected to the source region 721b through a contact hole that penetrates the interlayer insulating layer 724. The drain electrode 725b is electrically connected to the drain region 721c through a contact hole that penetrates the interlayer insulating layer 724.

According to an embodiment, a via layer 730 is disposed on the source electrode 725a and the drain electrode 725b. The via layer 730 may be formed of a single layer or of multiple layers of a silicon oxide film (SiOx) or a silicon nitride film (SiNx).

According to an embodiment, the photoelectric element layer PDL is disposed on the circuit element layer BPL. The photoelectric element layer PDL includes a photoelectric element PD, a barrier layer 750, an insulating layer 760, and a bias electrode 770.

According to an embodiment, the photoelectric element PD is disposed on the via layer 730. The photoelectric element PD includes a first electrode 741, an intermediate layer PIN, and a second electrode 745.

According to an embodiment, the first electrode 741 is directly disposed on the via layer 730. In the disclosure, "directly disposed" refers to there being no other layers between the first electrode 741 and the via layer 730.

According to an embodiment, the first electrode 741 is connected to the source electrode 725a of the transistor TR through a contact hole that penetrates the via layer 730. In another embodiment, the first electrode 741 is connected to the drain electrode 725b.

According to an embodiment, the first electrode 741 may be formed of an opaque metal such as molybdenum (Mo) or a transparent oxide such as indium tin oxide (ITO), indium zinc oxide (IZO), or zinc oxide (ZnO), according to the properties of the photoelectric element PD.

According to an embodiment, the intermediate layer PIN is disposed on the first electrode 741.

According to an embodiment, the intermediate layer PIN is formed from a material that can convert incident light into an electrical signal. For example, the intermediate layer PIN may include materials such as a-Se, HgI2, CdTe, PbO, PbI2, BiI3, GaAs, or Ge.

According to an embodiment, when the photoelectric element PD is formed of a PIN diode, the intermediate layer PIN is a structure in which an N-type (negative type) semiconductor layer 742 that includes an N-type impurity, an I-type semiconductor layer 743 that does not include an impurity, and a P-type (positive type) semiconductor layer 744 that includes a P-type impurity are sequentially stacked. Side surfaces of the N-type semiconductor layer 742, the I-type semiconductor layer 743, and the P-type semiconductor layer 744 are aligned. The I-type semiconductor layer 743 is relatively thicker than the N-type semiconductor layer 742 and the P-type semiconductor layer 744.

According to an embodiment, the photoelectric element PD configured of a PIN diode senses external light, converts the external light into an electrical signal, and outputs the electrical signal. Specifically, when light of a specific frequency range, such as the visible wavelengths, is irradiated to the intermediate layer PIN, the I-type semiconductor layer 743 is depleted by the P-type semiconductor layer 744 and the N-type semiconductor layer 742, and thus an electric field is generated inside. A hole and an electron generated by the light are moved by the electric field and are collected in the P-type semiconductor layer 744 and the N-type semiconductor layer 742.

According to an embodiment, the second electrode 745 is disposed on the intermediate layer PIN. The second electrode 745 is formed of a transparent conductive material such as indium tin oxide (ITO), indium zinc oxide (IZO), or zinc oxide (ZnO), according to the properties of the photoelectric element PD.

According to an embodiment, the area of the second electrode 745 is less than the area of the intermediate layer PIN. A side surface of the second electrode 745 is located inside a side surface of the intermediate layer PIN. That is, the second electrode 745 has an inset structure in which an edge of the intermediate layer PIN is exposed. A leakage current of the photoelectric element PD is reduced by disposing the second electrode 745 on the intermediate layer PIN in an inset structure.

According to an embodiment, the barrier layer 750 is disposed on the photoelectric element PD. The barrier layer 750 prevents side surface damage of the intermediate layer PIN and minimizes the leakage current of the photoelectric element PD.

According to an embodiment, the barrier layer 750 is directly disposed on the second electrode 745 of the photoelectric element PD. The barrier layer 750 is in contact with the second electrode 745 and the intermediate layer PIN, but is not in contact with the first electrode 741. The barrier layer 750 is spaced apart and separated from the first electrode 741 by the intermediate layer PIN.

According to an embodiment, the barrier layer 750 directly covers an upper surface and a side surface of the second electrode 745, and an upper surface of the P-type semiconductor layer 744 exposed by the second electrode 745. That is, the barrier layer 750 is in direct contact with the upper surface and the side surface of the second electrode 745, and the upper surface of the P-type semiconductor layer 744 exposed by the second electrode 745. A side surface of the barrier layer 750 is aligned with the side surface of the intermediate layer PIN.

According to an embodiment, the barrier layer 750 is formed of an inorganic film. The inorganic film includes at least one of SiNx, SiOx, or SiON, but is not limited thereto.

According to an embodiment, the insulating layer 760 is disposed on the barrier layer 750. The insulating layer 760 is disposed on the entire surface of the substrate 711.

According to an embodiment, the insulating layer 760 is directly disposed on the photoelectric element PD and the barrier layer 750. The insulating layer 760 directly covers a side surface of the photoelectric element PD and an upper surface and a side surface of the barrier layer 750. The insulating layer 760 is in contact with the first electrode 741 and the intermediate layer PIN, but is not in contact with the second electrode 745. The insulating layer 760 is spaced apart and separated from the second electrode 745 by the barrier layer 750.

According to an embodiment, a thickness of the insulating layer 760 is greater than a thickness of the barrier layer 750. The insulating layer 760 is formed of an inorganic film. The inorganic film includes at least one of SiNx, SiOx, or SiON, but is not limited thereto.

According to an embodiment, the bias electrode 770 is disposed on the insulating layer 760. The bias electrode 770 is electrically connected to the second electrode 745 of the photoelectric element PD through a contact hole that penetrates the insulating layer 760 and the barrier layer 750.

According to an embodiment, the planarization layer 780 is disposed on the bias electrode 770. The planarization layer 780 has a substantially flat upper surface, and improves surface flatness of the optical sensor PSL According to an embodiment, the planarization layer 780 may include an organic material or an inorganic material. For example, the planarization layer 780 is an organic material, and the planarization layer 780 is formed of one of a photoresist, a polyacrylic resin, a polyimide resin, a polyamide resin, a siloxane acid resin, an acrylic resin, or an epoxy resin, etc.

Figure 5:
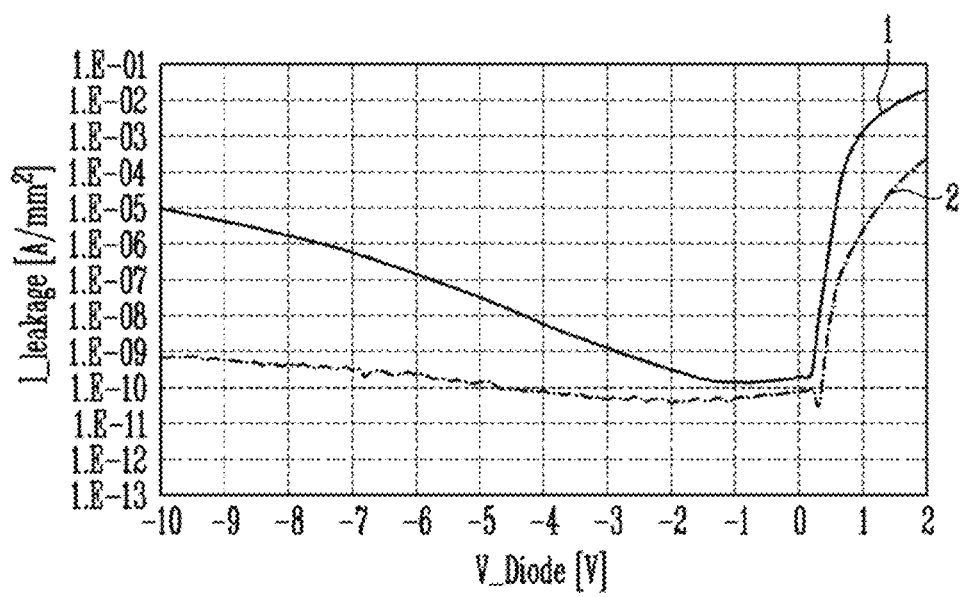
FIG. 5 is a graph of leakage current according to a driving voltage of the optical sensor, according to an embodiment.
Figure 6:
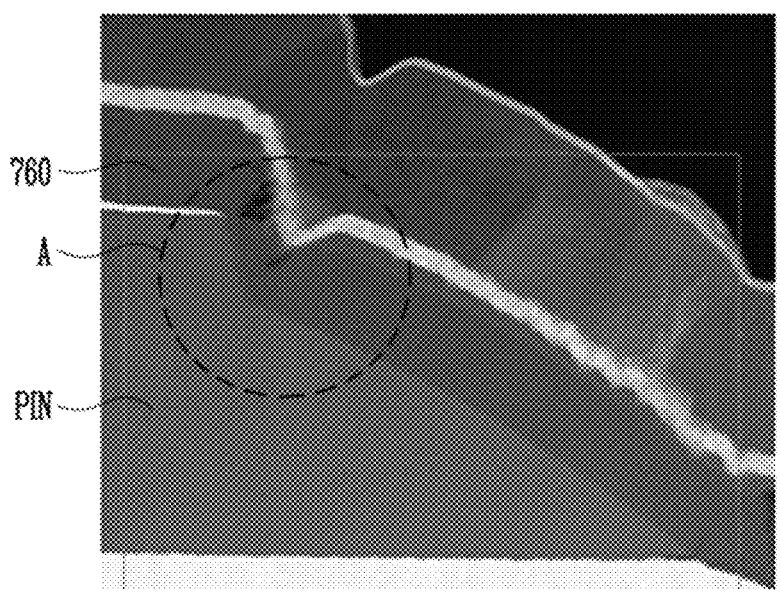
FIG. 6 illustrates a double taper of a side surface of a PIN diode, according to an embodiment.

FIG. 5 is a graph of leakage current according to a driving voltage of an optical sensor, according to an embodiment. FIG. 6 illustrates a double taper of a side surface of a PIN diode, according to an embodiment.

Specifically, according to an embodiment, FIG. 5 compares leakage currents I_leakage for each driving voltage V_Diode of the PIN diode as the photoelectric element PD, with respect to an optical sensor that does not include a barrier layer and an optical sensor in which the barrier layer 750 is disposed on the photoelectric element PD as in an above-described embodiment.

In general, according to an embodiment, a PIN diode may be driven from −7 to −3V. When no separate barrier layer is disposed on the PIN diode, a double taper is formed on a side surface of the intermediate layer when the intermediate layer of the PIN diode is formed. Specifically, referring to FIG. 6, when no separate barrier layer is disposed, a double taper is formed as a region A in a process of etching the PIN diode. In this case, due to the double taper of the PIN diode, a crack, etc., can occur in the insulating layer 760 disposed in an upper portion, and a current can leak into an exposed area when the PIN diode is driven. That is, as shown in a first graph 1, a considerable amount of leakage current I_leakage can occur. The leakage current I_leakage acts as noise with respect to a sensing current of the PIN diode, and as a result, sensing accuracy is reduced.

On the other hand, according to an embodiment, when the barrier layer 750 is formed on the photoelectric element PD as described above, damage of the side surface of the intermediate layer PIN is effectively prevented. Therefore, as shown in a second graph 2, the leakage current I_leakage is minimized when the PIN diode is driven, and as a result, sensing accuracy is improved.

Hereinafter, another embodiment is described. In a following embodiment, the same elements as those already described will be referred to by the same reference numeral, and a repetitive description will be omitted or simplified.

Figure 7:
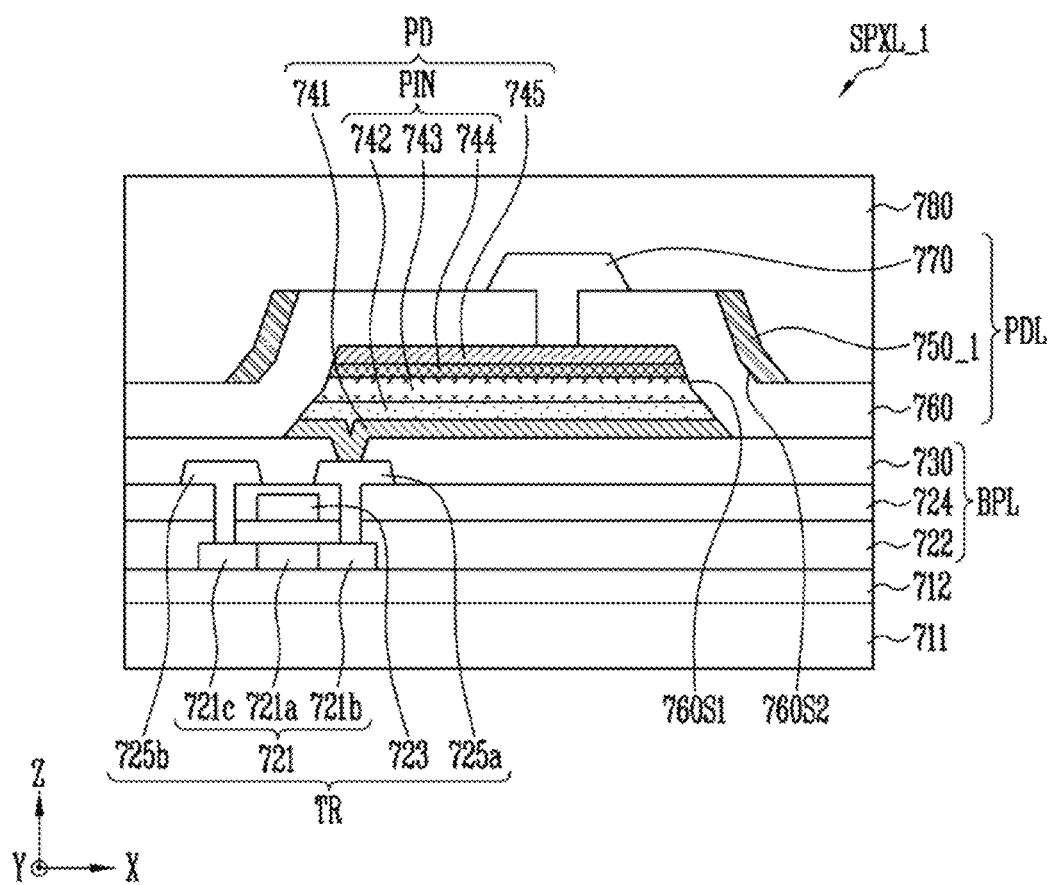
FIG. 7 is a cross-sectional view of a sensor pixel according to another embodiment.

FIG. 7 is a cross-sectional view of a sensor pixel according to another embodiment.

Referring to FIG. 7, the sensor pixel SPXL_1 according to a present embodiment differs from the sensor pixel SPXL of FIGS. 1 to 4 in that a barrier layer 750_1 is disposed on the insulating layer 760.

According to an embodiment, the insulating layer 760 directly covers the photoelectric element PD. The insulating layer 760 includes a first surface that covers an upper surface of the photoelectric element PD, a second surface that is in contact with the circuit element layer BPL, and a inner side surface 760S1 that covers the side surface of the photoelectric element PD. The inner side surface 760S1 of the insulating layer 760 directly covers the side surface of the photoelectric element PD.

According to an embodiment, the barrier layer 750_1 is directly disposed on an outer side surface 760S2 of the insulating layer 760. The barrier layer 750_1 directly covers the outer side surface 760S2 of the insulating layer 760. In this case, even though a double taper is formed on the side surfaces of the photoelectric element PD, the barrier layer 750_1 provides a discharge path of the leakage current. Therefore, as described above, noise in the sensing current is reduced, and as a result, accuracy of the fingerprint sensing is improved.

According to an embodiment, the barrier layer 7501 is a transparent conductive pattern. The transparent conductive pattern includes at least one of ITO, IZO, or ZnO as a transparent metal oxide, but is not limited thereto. The barrier layer 750_1 is an electrode in a floating state. That is, the barrier layer 7501 is an electrode formed in an island shape, to which no electric signal, such as a voltage, is separately applied.

According to an embodiment, the bias electrode 770 is disposed on the insulating layer 760. The bias electrode 770 is disposed on an upper surface of the insulating layer 760 that is not covered by the barrier layer 7501. The bias electrode 770 is in contact with the second electrode 745 of the photoelectric element PD through a contact hole that penetrates the insulating layer 760.

According to an embodiment, the planarization layer 780 is disposed on the insulating layer 760. The planarization layer 780 directly covers the insulating layer 760, the barrier layer 750_1, and the bias electrode 770.

Figure 8:
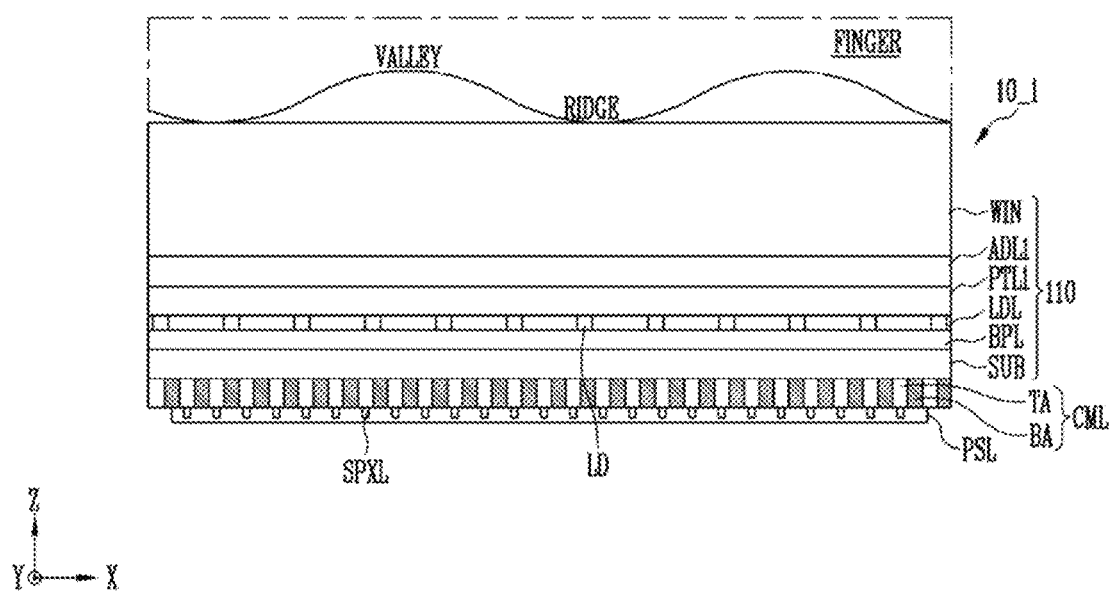
FIG. 8 is a cross-sectional view of a display device according to still another embodiment.

FIG. 8 is a cross-sectional view of a display device according to still another embodiment.

Referring to FIG. 8, the display device 101 according to a present embodiment differs from the display device 10 of FIGS. 1 to 4 in that the opening array layer is omitted and the display device 10_1 includes a collimator CML Specifically, according to an embodiment, the collimator CML is disposed between the display panel 110 and the optical sensor PSL.

According to an embodiment, the collimator CML distinguishes light reflected from the ridge of a user's finger from light reflected from the valley and provides the light reflected from the ridge and the light reflected from the valley to separate sensor pixels SPXL. To this end, the collimator CML includes alight blocking pattern BA and a plurality of light transmitting patterns TA that penetrate the light blocking pattern BA.

According to an embodiment, the light blocking pattern BA includes at least one of an organic light blocking material or a metallic light blocking material. For example, a organic light blocking material includes at least one of carbon black (CB) or titanium black (TiBK), but is not limited thereto. In addition, a metallic light blocking material includes at least one of chromium, chromium oxide, or chromium nitride, but is not necessarily limited thereto.

According to an embodiment, the plurality of light transmitting patterns TA have an optical path of light emitted from the light emitting element LD, reflected from the finger of the user, and propagating to the optical sensor PSL.

According to an embodiment, the plurality of light transmitting patterns TA include an acrylic resin or a polyacrylate resin, an epoxy resin, a phenolic resin, a polyamide resin, a polyimide resin, an unsaturated polyester resin, a poly phenylenether resin, a polyphenylenesulfide resin, or benzocyclobutene (BCB), but is not limited thereto.

In accordance with the display device 10_1 according to a present embodiment, light reflected from the ridge of a user's finger can be distinguished from light reflected from the valley and is provided to separate sensor pixels SPXL by disposing the collimator CML between the display panel 110 and the optical sensor PSL. Thus, a signal-to-noise ratio SNR of the optical sensor PSL is improved.

Subsequently, a method of manufacturing an optical sensor according to embodiments described above will be described.

FIGS. 9 to 12 are cross-sectional views that illustrate a method of manufacturing an optical sensor according to an embodiment. In particular, FIGS. 9 to 12 show the process steps of manufacturing the sensor pixel SPXL of FIG. 4.

Figure 9:
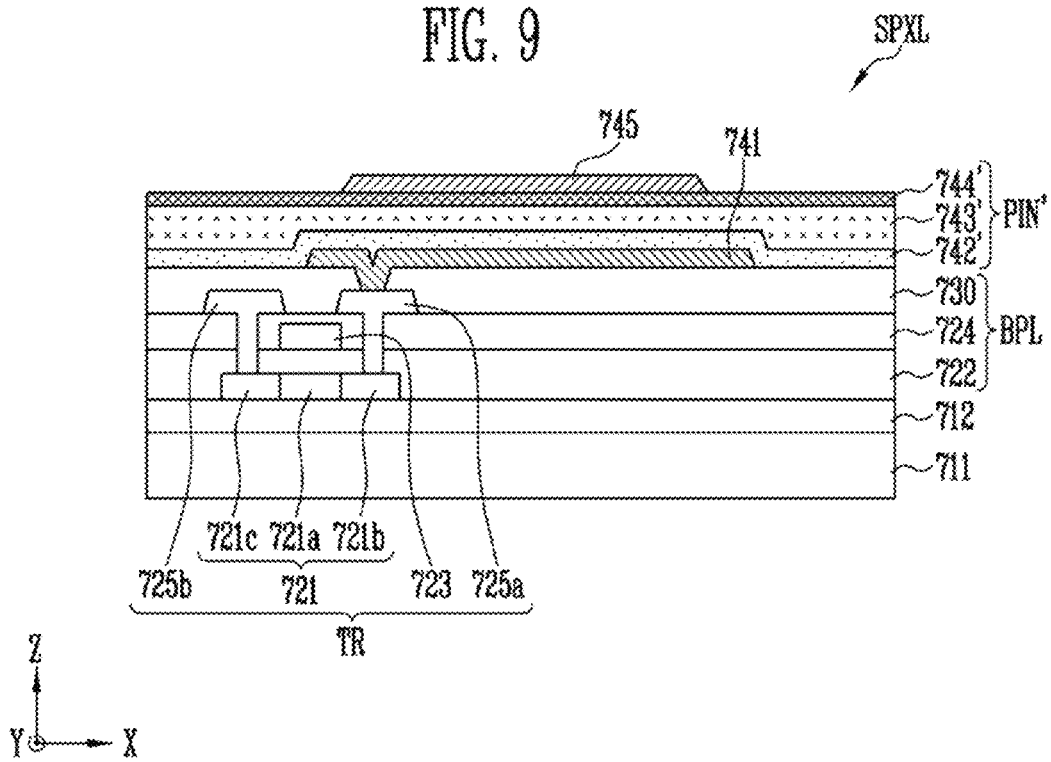
FIGS. 9 to 12 are cross-sectional views that illustrate a method of manufacturing the optical sensor according to an embodiment.

First, referring to FIG. 9, according to an embodiment, the buffer layer 712, the circuit element layer BPL, the first electrode 741, the intermediate film PIN', and the second electrode 745 are formed on the substrate 711.

According to an embodiment, the active pattern 721, the gate insulating layer 722, the gate electrode 723, the interlayer insulating layer 724, the source electrode 725a, the drain electrode 725b, and the via layer 730 are sequentially formed on the buffer layer 712, and thus the circuit element layer BPL is provided.

According to an embodiment, a method of forming each of the above-described layers uses generally known deposition, photoresist coating (PR coating), exposure, development, etching, or photolithography processes, including photoresist stripping (PR stripping). Detailed description of these processes is omitted. For example, in a case of deposition, a method such as sputtering is used for a metal and a method such as plasma enhanced vapor deposition (PECVD) is used for a semiconductor or an insulating film. In addition, in a case of etching, dry etching and wet etching may be selectively used according to a material.

According to an embodiment, the first electrode 741 of the photoelectric element PD that is connected to the source electrode 725a through the contact hole that penetrates the via layer 730 is disposed on the via layer 730.

Next, according to an embodiment, the intermediate film PIN' that includes an N-type semiconductor film 742', an I-type semiconductor film 743', and a P-type semiconductor film 744' is formed on the first electrode 741. The N-type semiconductor film 742', the I-type semiconductor film 743', and the P-type semiconductor film 744' are formed on the entire surface of the substrate 711.

Next, according to an embodiment, a second electrode film is deposited and patterned on the P-type semiconductor film 744' to form the second electrode 745.

Figure 10:
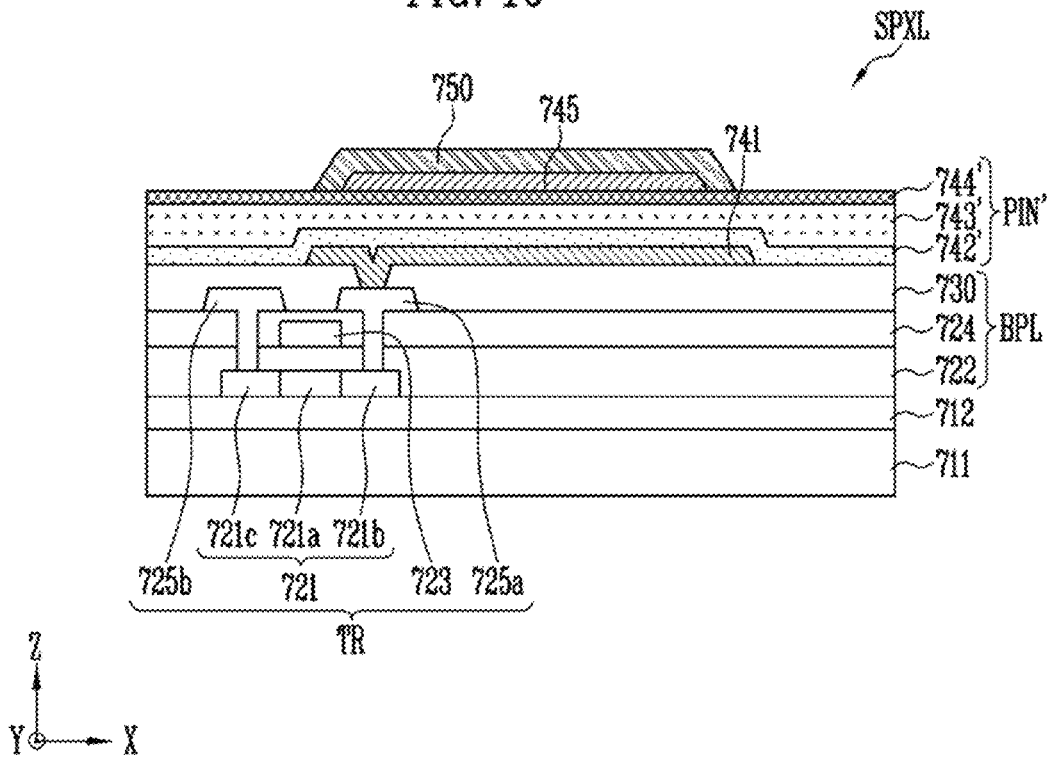

Next, referring to FIG. 10, according to an embodiment, the barrier layer 750 is formed on the second electrode 745.

The barrier layer 750 has an area greater than that of the second electrode 745 and covers the second electrode 745. A step of forming the barrier layer 750 may be performed by, for example, plasma chemical vapor deposition (PECVD).

According to an embodiment, the barrier layer 750 is formed of an inorganic film that can adjust selectivity with respect to the intermediate film PIN'. For example, the barrier layer 750 may be formed of a silicon nitride layer, a silicon oxy nitride layer, a silicon oxide layer, a titanium oxide layer, or an aluminum oxide layer, but is not limited thereto.

Figure 11:
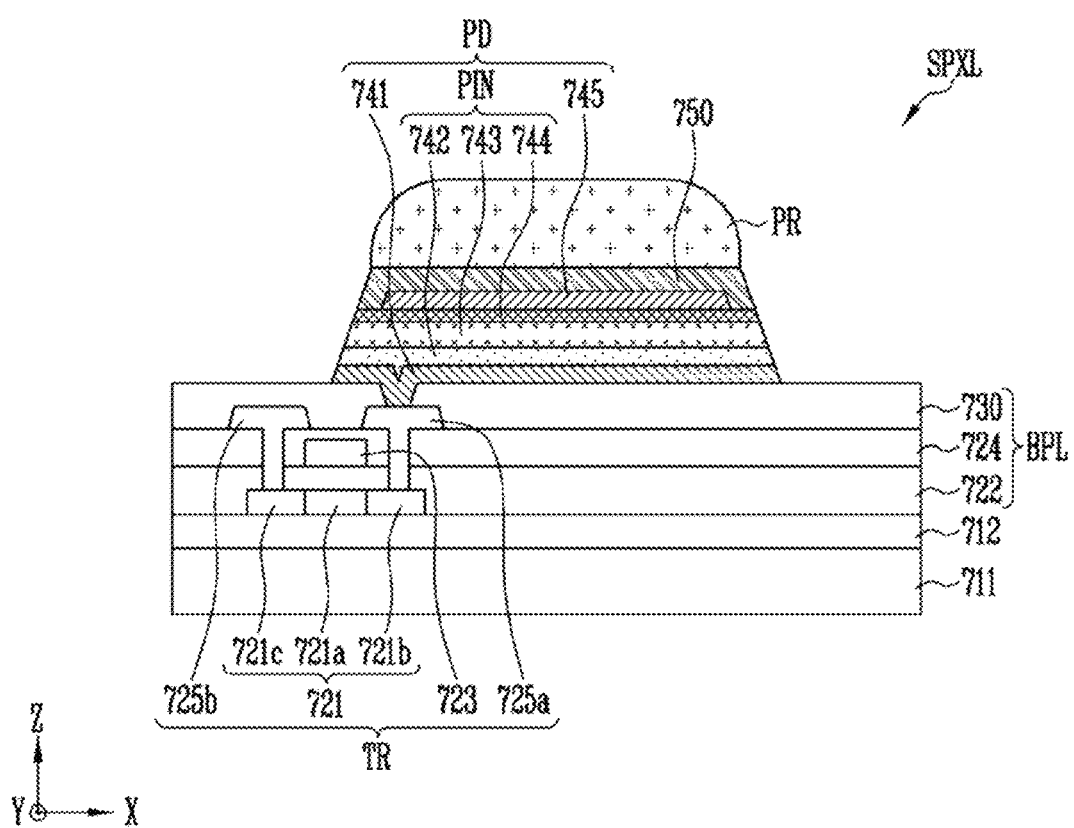

Next, referring to FIG. 11, according to an embodiment, a photoresist pattern PR is formed on the barrier layer 750, and the intermediate film PIN' is patterned to form the intermediate layer PIN. Etching of the intermediate film PIN' is performed by dry etching such as an oxygen plasma process.

According to an embodiment, since the second electrode 745 is covered by the barrier layer 750 in a process of etching the intermediate film PIN', a double taper, that is, side damage, is prevented on the side surface of the intermediate layer PIN by the second electrode 745. Therefore, as described above, the leakage current that occurs in the side surface of the photoelectric element is minimized to reduce noise in the sensing current, and as a result, the accuracy of the fingerprint sensing is improved.

Figure 12:
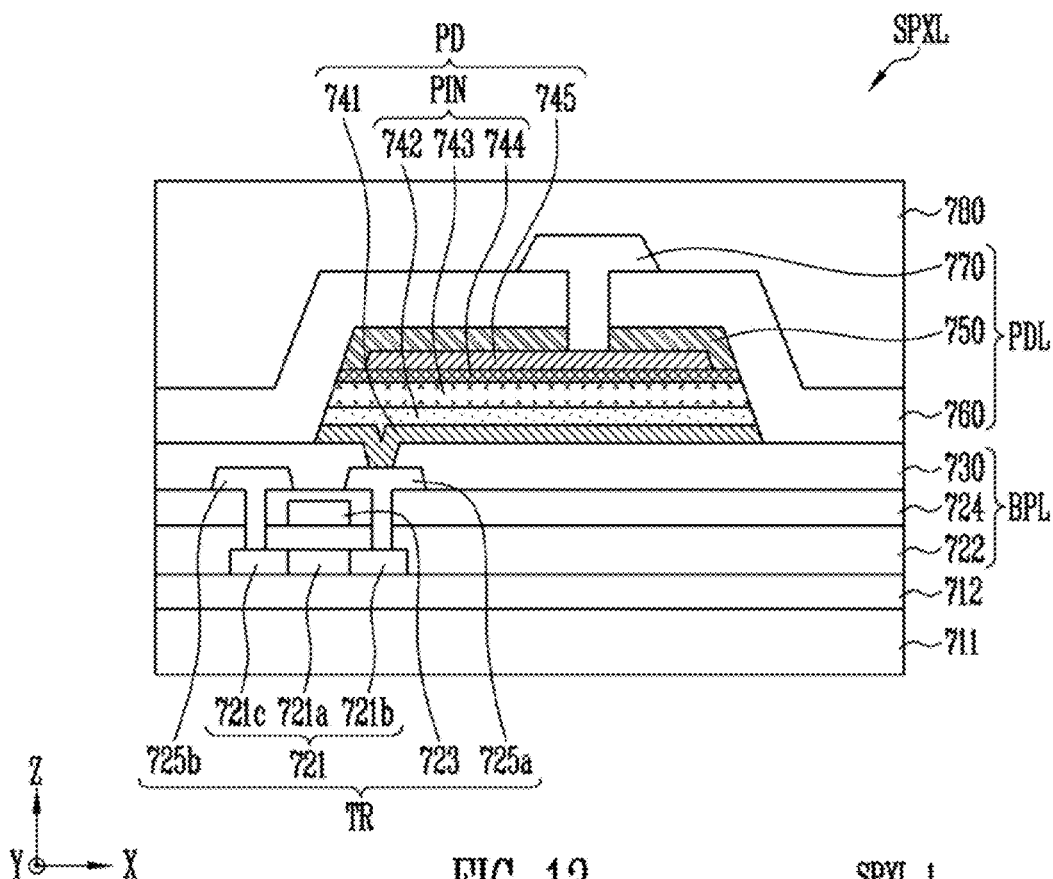

Next, referring to FIG. 12, according to an embodiment, the insulating layer 760, the bias electrode 770, and the planarization layer 780 are formed on the barrier layer 750 to complete the sensor pixel SPXL of FIG. 4.

FIGS. 13 to 17 are cross-sectional views that illustrate a method of manufacturing the optical sensor according to another embodiment. In particular, FIGS. 13 to 17 show the process steps of manufacturing the sensor pixel SPXL_1 of FIG. 7.

Figure 13:
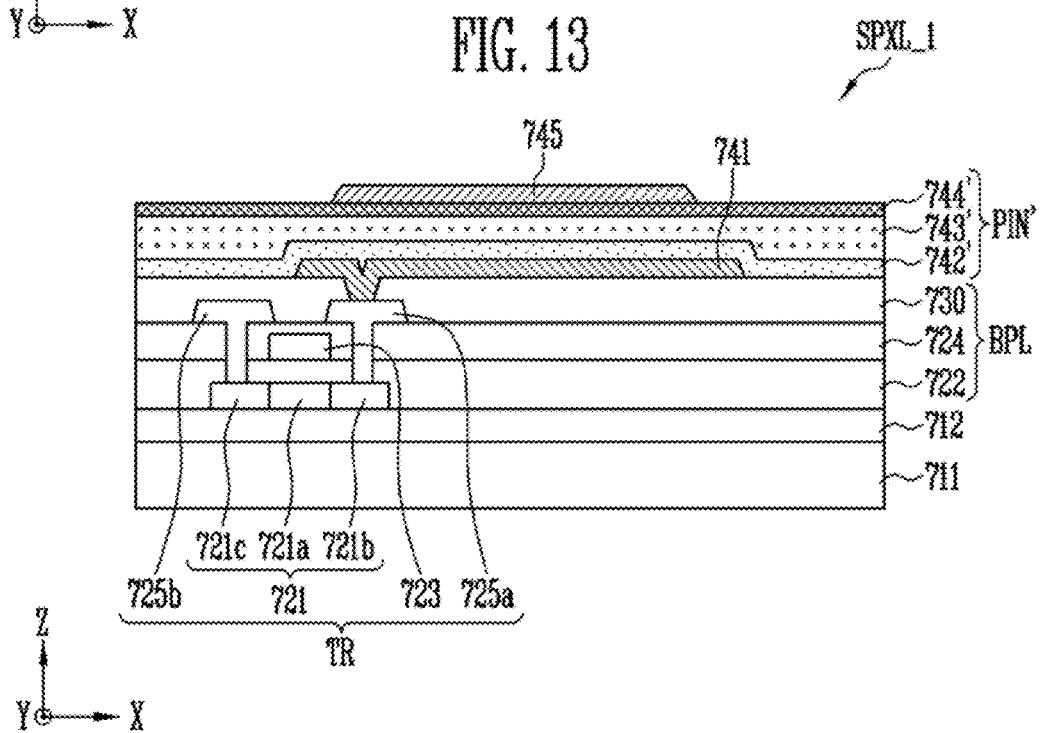
FIGS. 13 to 17 are cross-sectional views that illustrate a method of manufacturing the optical sensor according to another embodiment.

First, referring to FIG. 13, according to an embodiment, the buffer layer 712, the circuit element layer BPL, the first electrode 741, the intermediate layer PIN', and the second electrode 745 are formed on the substrate 711. Since forming the buffer layer 712, the circuit element layer BPL, the first electrode 741, the intermediate film PIN', and the second electrode 745 is substantially the same as or similar to the manufacturing steps described with reference to FIG. 9, a repetitive description is omitted.

Figure 14:
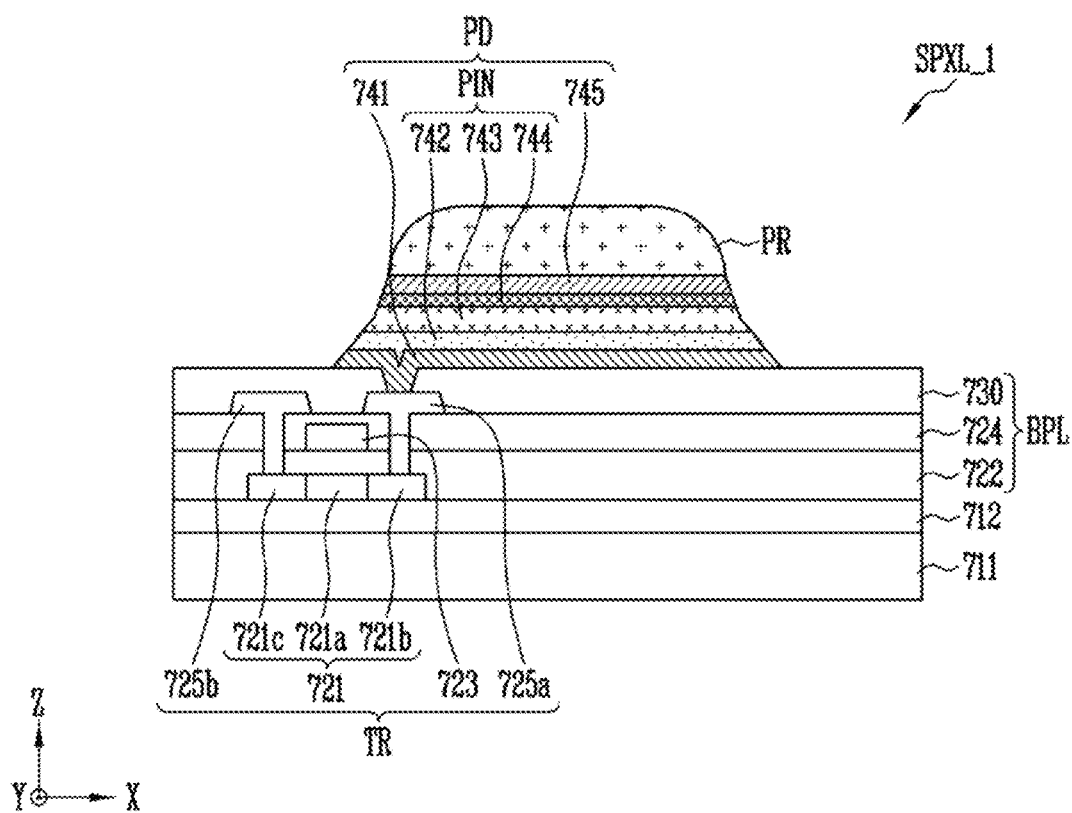

Next, referring to FIG. 14, according to an embodiment, the photoresist pattern PR is formed on the second electrode 745, and the intermediate film PIN' is patterned to form the intermediate layer PIN. The second electrode 745 may be exposed in a process of etching the intermediate film PIN'. In this case, the intermediate film PIN' is masked by the second electrode 745 rather than the photoresist pattern PR. Therefore, a double taper is formed on the side surface of the intermediate layer PIN.

Figure 15:
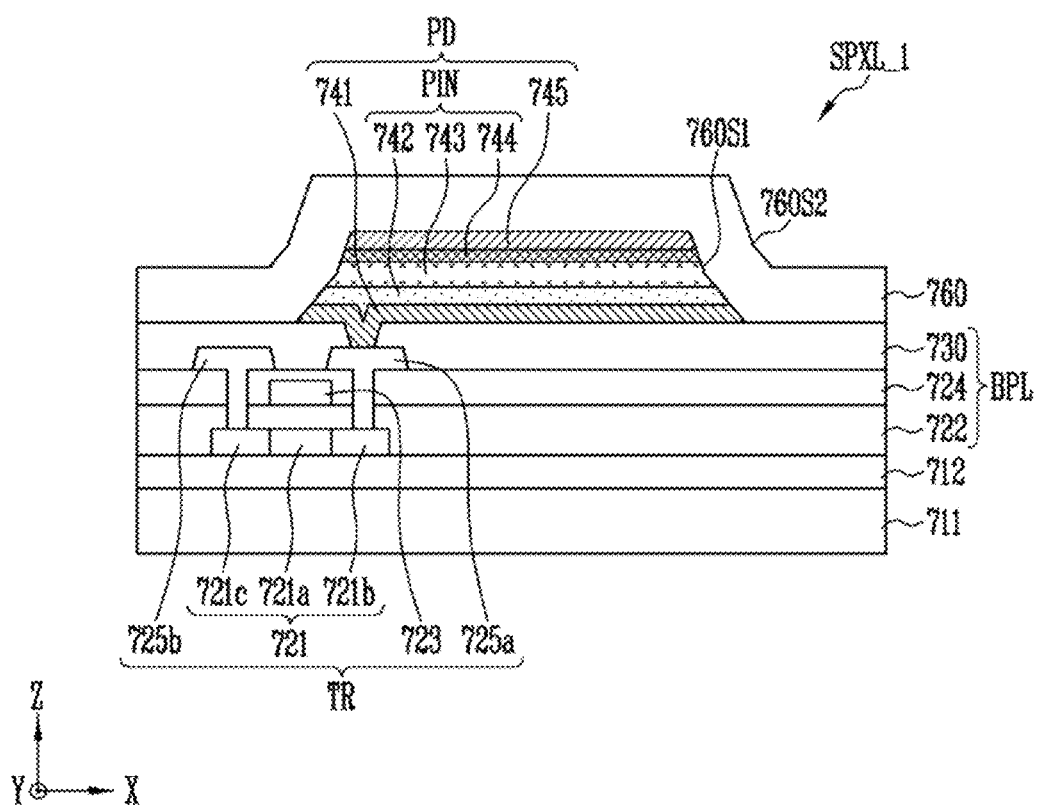

Next, referring to FIG. 15, according to an embodiment, the insulating layer 760 is formed on the photoelectric element PD. The insulating layer 760 may be formed of a silicon nitride layer, a silicon oxy nitride layer, a silicon oxide layer, a titanium oxide layer, or an aluminum oxide layer, but is not limited thereto.

Figure 16:
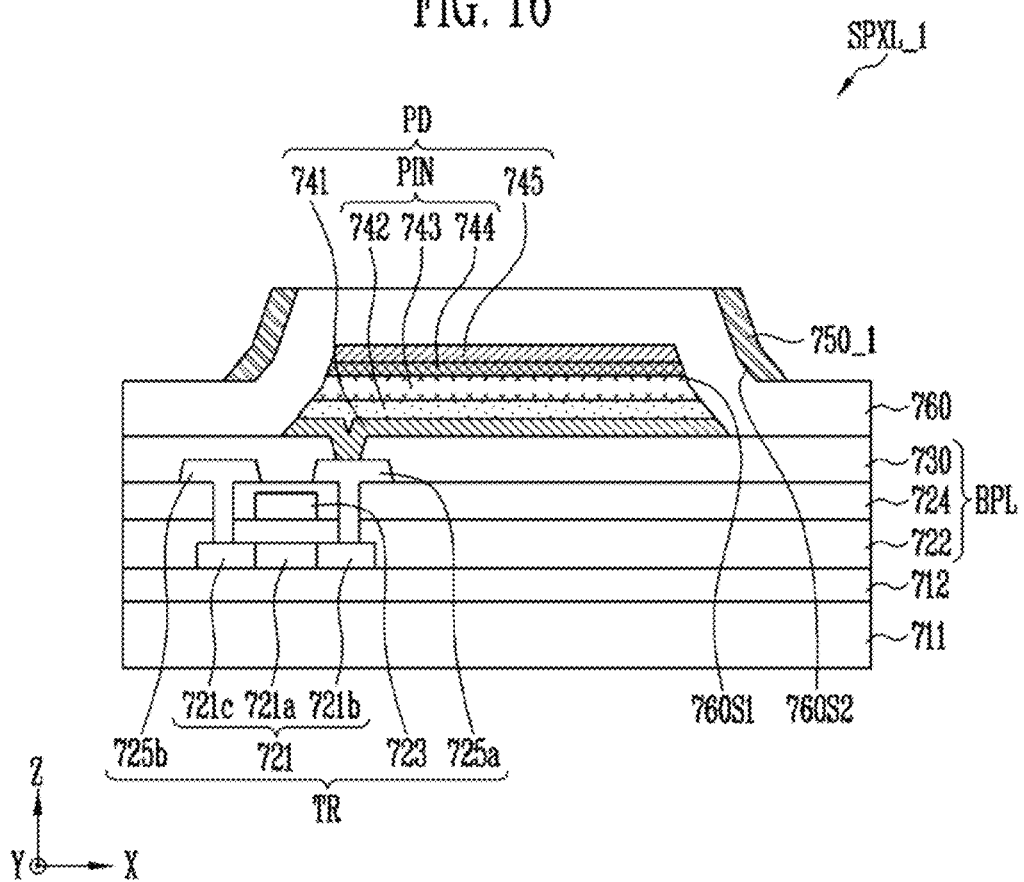
Figure 17:
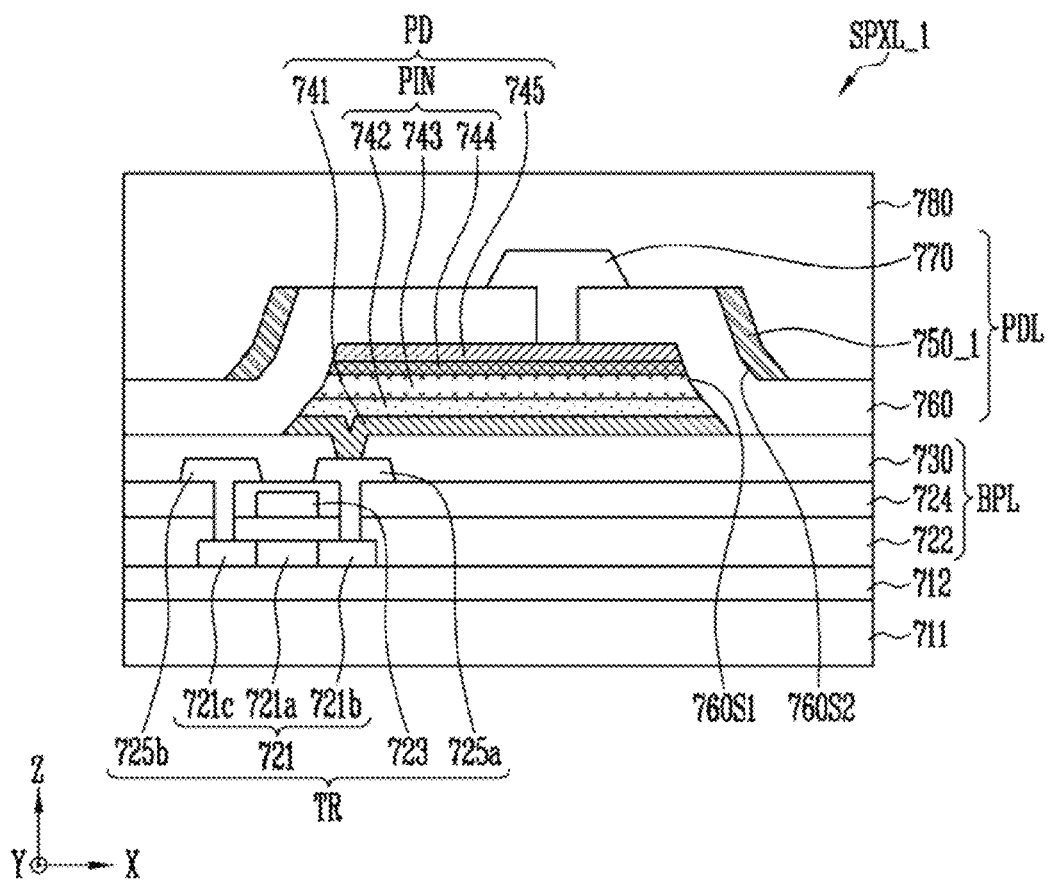

Next, referring to FIG. 16, according to an embodiment, the barrier layer 750_1 is formed on the outer side surface 760S2 of the insulating layer 760 that covers the side surface of the photoelectric element PD. The barrier layer 750_1 is formed by forming and patterning a transparent conductive material layer. The transparent conductive material layer includes at least one of ITO, IZO, or ZnO as a transparent metal oxide, but is not limited thereto.

According to an embodiment, when the outer side surface 760S2 of the insulating layer 760 is covered by the barrier layer 7501, even though a double taper is formed on the side surface of the photoelectric element PD in the process of etching the intermediate film PIN', a discharge path of a leakage current is provided by the barrier layer 750_1. Therefore, as described above, noise in the sensing current is reduced, and as a result, the accuracy of the fingerprint sensing is improved. Next, referring to FIG. 17, the bias electrode 770 and the planarization layer 780 are formed on the barrier layer 750_1 and the insulating layer 760 to complete the sensor pixel SPXL_1 of FIG. 7.

Those skilled in the art will understand that embodiments of the disclosure can be implemented in other specific forms without changing the technical spirit or essential characteristics thereof. Therefore, it should be understood that exemplary embodiments are illustrative and not restrictive in all aspects. The scope of embodiments of the disclosure is defined by the following claims rather than the above detailed description, and it is intended that all changes and modifications drawn from the meaning and range of the claims and the equivalents thereof are included within the scope of embodiments of the disclosure.

What is claimed is:

1. An optical sensor, comprising:
    a substrate;
    a photoelectric element disposed on the substrate, wherein the photoelectric element includes a first electrode, an intermediate layer disposed on the first electrode, and a second electrode disposed on the intermediate layer;
    an insulating layer disposed on the photoelectric element;
    a bias electrode disposed on the insulating layer and electrically connected to the second electrode; and
    a conductive pattern that covers an outer side surface of the insulating layer, wherein the conductive pattern is in a floating state,
    wherein an inner side surface of the insulating layer covers a side surface of the photoelectric element.

2. The optical sensor according to claim 1, wherein the bias electrode is in direct contact with the second electrode through a contact hole that penetrates the insulating layer.

3. The optical sensor according to claim 1, wherein the conductive pattern is formed of a transparent metal oxide.

4. The optical sensor according to claim 3, wherein the transparent metal oxide includes at least one of ITO, IZO, or ZnO.

5. The optical sensor according to claim 1, wherein the intermediate layer comprises:
    an N-type semiconductor layer disposed on the first electrode;
    an I-type semiconductor layer disposed on the N-type semiconductor layer; and
    a P-type semiconductor layer disposed on the I-type semiconductor layer.

6. The optical sensor according to claim 1, further comprising:
    a circuit element layer disposed between the substrate and the photoelectric element,
    wherein the circuit element layer comprises:
    an active pattern that includes a channel region, a source region disposed on one side of the channel region, and a drain region disposed on another side of the channel region;
    a gate insulating layer that covers the active pattern;
    a gate electrode disposed on the gate insulating layer and that overlaps the channel region;

an interlayer insulating layer that covers the gate electrode;
a source electrode disposed on the interlayer insulating layer and connected to the source region and a drain electrode disposed on the interlayer insulating layer and connected to the drain region; and
a protective layer that covers the source electrode and the drain electrode.

7. The optical sensor according to claim 1, further comprising:
a planarization layer that directly covers the conductive pattern, the bias electrode, and the insulating layer.

* * * * *